United States Patent
Choi et al.

(10) Patent No.: US 11,763,874 B2
(45) Date of Patent: Sep. 19, 2023

(54) FEEDBACK FOR POWER MANAGEMENT OF A MEMORY DIE USING SHORTING

(71) Applicant: Micron Technology, Inc., Boise, ID (US)

(72) Inventors: Baekkyu Choi, San Jose, CA (US); Thomas H. Kinsley, Boise, ID (US); Fuad Badrieh, Boise, ID (US)

(73) Assignee: Micron Technology, Inc., Boise, ID (US)

(*) Notice: Subject to any disclaimer, the term of this patent is extended or adjusted under 35 U.S.C. 154(b) by 58 days.

(21) Appl. No.: 17/480,685

(22) Filed: Sep. 21, 2021

(65) Prior Publication Data

US 2022/0076729 A1    Mar. 10, 2022

Related U.S. Application Data

(63) Continuation of application No. 16/740,281, filed on Jan. 10, 2020, now Pat. No. 11,133,052.

(51) Int. Cl.
*G11C 11/00* (2006.01)
*G11C 11/4074* (2006.01)
*G06F 3/06* (2006.01)

(52) U.S. Cl.
CPC ........ *G11C 11/4074* (2013.01); *G06F 3/0625* (2013.01); *G06F 3/0659* (2013.01); *G06F 3/0673* (2013.01)

(58) Field of Classification Search
CPC ....... G11C 11/4074; G11C 5/147; G11C 7/04; G11C 29/021; G11C 29/025; G11C 5/14; G11C 11/4091; G11C 7/08; G06F 3/0625; G06F 3/0659; G06F 3/0673; G06F 3/0619; G06F 3/0626; G06F 3/0634; G06F 3/0653; G06F 3/0671; G06F 3/0676; G06F 3/0679; G06F 1/16; G06F 1/187; G06F 1/189;
(Continued)

(56) References Cited

U.S. PATENT DOCUMENTS

| 9,189,053 | B2 | 11/2015 | Cui et al. |
| 9,350,155 | B2 * | 5/2016 | Petivan, III .......... G11C 29/021 |
| 2015/0043256 | A1 | 2/2015 | Domingo |

(Continued)

OTHER PUBLICATIONS

ISA/KR, International Search Report and Written Opinion of the International Searching Authority, Int'l Appl. No. PCT/US2020/067211, dated Apr. 19, 2021, Korean Intellectual Property Office, Seo-gu, Daejeon, Republic of Korea, 9pgs.

*Primary Examiner* — Thong Q Le
(74) *Attorney, Agent, or Firm* — Holland & Hart LLP

(57) ABSTRACT

Methods, systems, and devices for feedback for power management of a memory die using shorting are described. A memory device may short a first rail with a voltage source for communicating feedback regarding a supply voltage to a power management component, such as a power management integrated circuit of a memory system. The memory device may detect a condition of one or more voltage rails for delivering power coupled with the array of memory cells. The memory device may short a first rail of the network of components for delivering power with a voltage source based on detecting the condition. In some cases, the memory device may generate a feedback signal across the first rail of the network of components for delivering power based on shorting the first rail.

20 Claims, 5 Drawing Sheets

(58) Field of Classification Search
CPC ...... G06F 1/26; G06F 11/201; G06F 11/2089; H02J 2300/24; H02J 3/381
See application file for complete search history.

(56) References Cited

U.S. PATENT DOCUMENTS

| | | |
|---|---|---|
| 2015/0106634 A1 | 4/2015 | Kokai et al. |
| 2016/0246363 A1 | 8/2016 | Chen |
| 2017/0102760 A1 | 4/2017 | Duell et al. |
| 2019/0179685 A1 | 6/2019 | Ki |

* cited by examiner

FEEDBACK FOR POWER MANAGEMENT OF A MEMORY DIE USING SHORTING

CROSS REFERENCE

The present application for patent is a continuation of U.S. patent application Ser. No. 16/740,281 by Choi et al., entitled "FEEDBACK FOR POWER MANAGEMENT OF A MEMORY DIE USING SHORTING," filed Jan. 10, 2020, assigned to the assignee hereof, and is expressly incorporated by reference in its entirety herein.

BACKGROUND

The following relates generally to one or more memory systems and more specifically to feedback for power management of a memory die using shorting.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
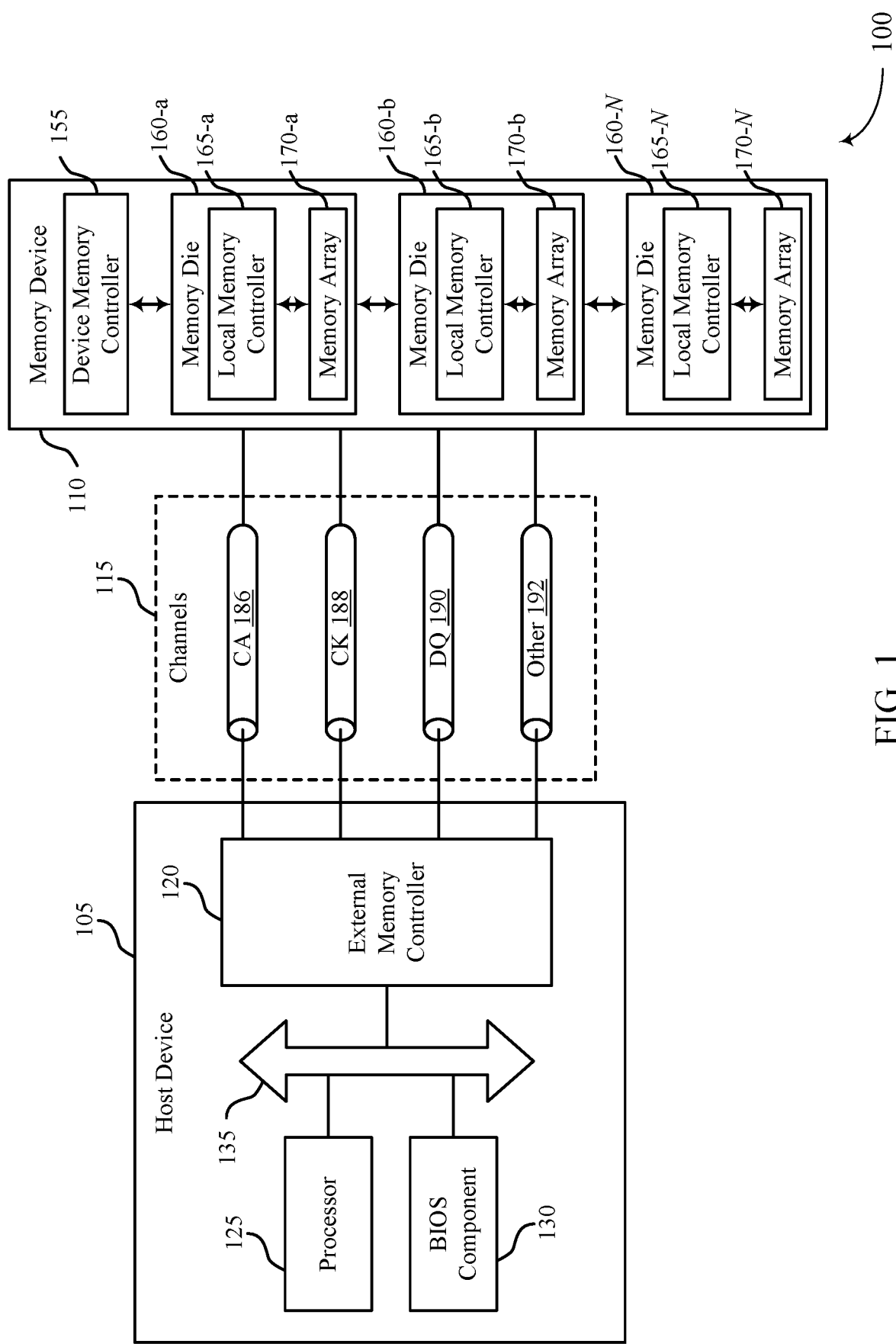
FIG. 1 illustrates an example of a system that supports feedback for power management of a memory die using shorting in accordance with examples as disclosed herein.

In some memory systems, a power management component, such as a power management integrated circuit (PMIC), may be used to manage the power supplied to one or more memory devices by controlling the voltage of a power supply rail. The voltages on the power supply rail may vary for a variety of reasons. For example, the voltage on a power supply rail may be attenuated at locations farther away from the power management component due to parasitic capacitance along the rail or other factors. For memory devices that are relatively far away from the power management component, the voltage on the power supply rail may be sufficiently attenuated to drop below a minimum supply voltage, which may cause errors at the memory device.

A power management component may not have access to information about the voltage at various locations along the rail and may not be able to adjust the power supplied to the rail to compensate for such variations (either too high or too low voltage). In other examples, voltages supplied to memory devices may vary within a given range. Functions of memory devices may be improved when supply voltages are provided with tighter tolerances, thereby minimizing the variance between supply voltages. To improve the functioning of the memory device, the memory device may measure supply voltages and provide feedback to a power management component.

The memory device may communicate feedback to a power management component using the voltage rails themselves. For example, a memory device may cause disturbances on the voltage rails themselves to indicate feedback information to the power management component. In some cases, the memory device may short a first voltage rail with a second voltage rail to indicate feedback information. The memory device may detect a condition (i.e., a high voltage and/or high temperature of the memory device) and short two voltage rails. Shorting the two voltage rails may cause a voltage pulse to be sent to the power management component. In such cases, the voltage pulse may be an example of a feedback signal generated by the memory device and communicated to the power management component to enable the power management component to adjust the voltage appropriately. The power management component may use such feedback information to determine whether and how to adjust the power (e.g., the supply voltage) that is supplied to the memory device via the power supply rail; that is, the power management component may adjust the voltage of a rail based on the feedback received from one or more memory devices.

Features of the disclosure are initially described in the context of memory systems and dies as described with reference to FIG. 1. Features of the disclosure are described in the context of a memory system as described with reference to FIG. 2. These and other features of the disclosure are further illustrated by and described with reference to an apparatus diagram and flowcharts that relate to feedback for power management of a memory die using shorting as described with references to FIGS. 3-5.

FIG. 1 illustrates an example of a system 100 that supports feedback for power management of a memory die using shorting in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

In some examples, the system 100 or the host device 105 may include an I/O controller. An I/O controller may manage data communication between the processor 125 and the peripheral component(s), input devices, or output devices. The I/O controller may manage peripherals that are not integrated into or with the system 100 or the host device 105. In some examples, the I/O controller may represent a physical connection or port to external peripheral components.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

In some examples, a memory die 160 may be coupled with a power management component that is operable to provide one or more supply voltages to the memory die 160. For example, the power management component may supply a VDD voltage, a VSS voltage, a VDDQ voltage, etc. using power supply rails (e.g., conductive lines). The power management component may be operable to maintain a substantially constant supply voltage on the rail to provide power to the memory device 110 or memory die 160 during operation. The power management component may include or may be coupled with one or more voltage supply components that are operable to generate the appropriate supply voltage.

In some cases, the voltage along a power supply rail may vary along the rail. For example, as the distance from the power management component increases the voltage on the power supply rail may attenuate due to, for example, parasitic capacitance along the rail. Thus, if multiple memory dies 160 are coupled with a power supply rail that provides a supply voltage to the memory dies 160, a memory die 160 that is relatively far away from the power management component may receive a lower supply voltage than a memory die 160 that is closer to the power management component. In some cases, if the supply voltage dips below a lower voltage threshold, the memory die 160 may experience errors.

As described herein, in some cases, the memory device 110 may short a first rail with a second rail for providing feedback to the power management component regarding the supply voltage on the power supply rail at the memory die 160, thereby enabling the power management component to adjust the supply voltage appropriately.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

In some cases, a local memory controller 165 of a memory die 160 may be operable to determine whether a voltage satisfies a voltage threshold, whether a temperature satisfies a temperature threshold. If the local memory controller 165 determines that the voltage or temperature satisfies the threshold, respectively, the local memory controller 165 may short the first rail with the second rail. In some cases, a feedback component of the memory device 110 may be implemented by a device memory controller 155, a local memory control 165, or a combination thereof.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Figure 2:
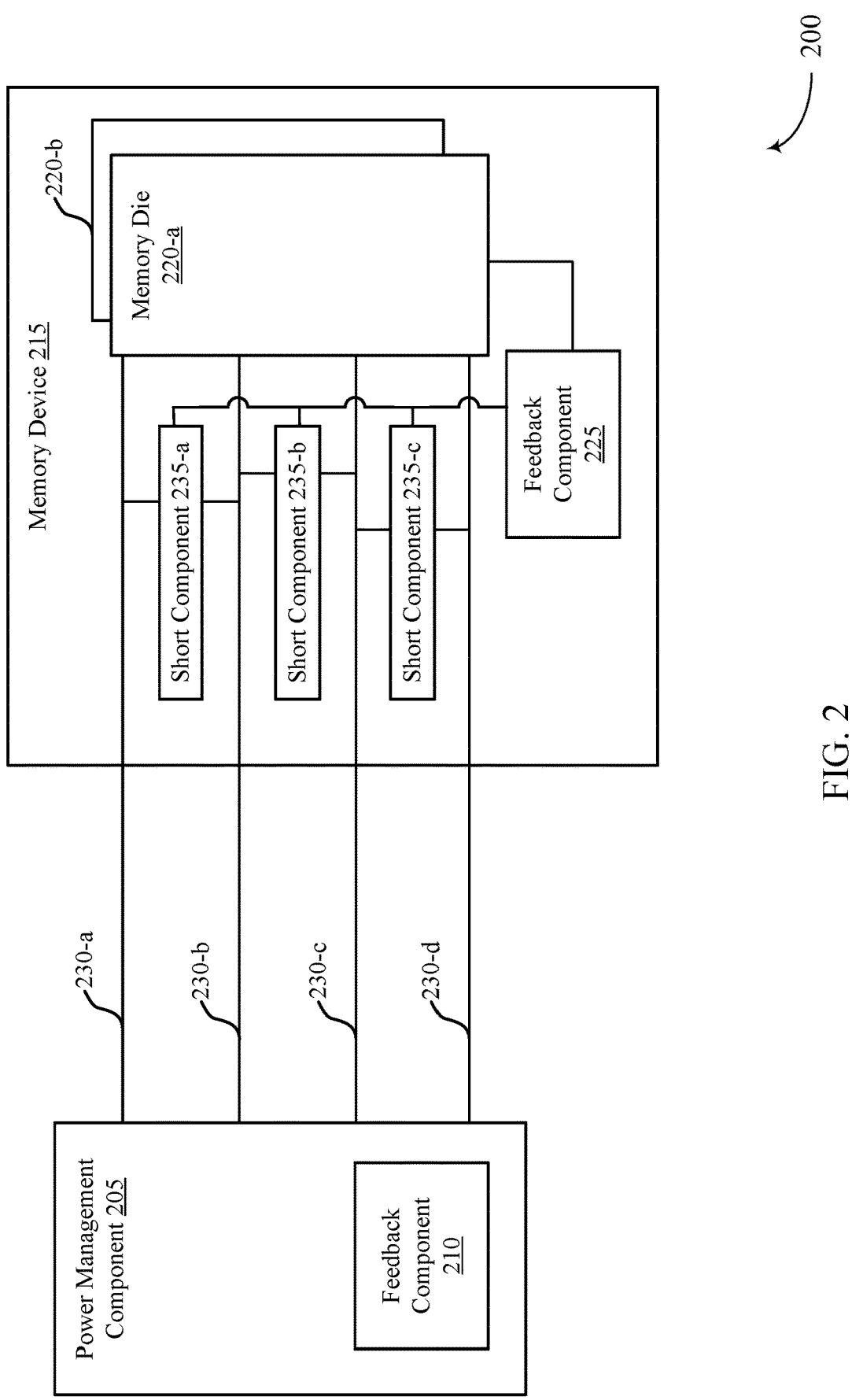
FIG. 2 illustrates an example of a memory system that supports feedback for power management of a memory die using shorting in accordance with examples as disclosed herein.

FIG. 2 illustrates an example of a memory system 200 that supports feedback for power management of a memory die using shorting in accordance with examples as disclosed herein. The memory system 200 may include a power management component 205 that includes a feedback component 210, a memory device 215 that includes a memory die 220-*a* and a memory die 220-*b*. The power management component 205 may be in electronic communication with the memory device 215 via voltage rails, 230-*a*, 230-*b*, 230-*c*, and 230-*d*. The memory device 215 may also include short components 235-*a*, 235-*b*, and 235-*c* and feedback component 225. The memory device 215 may be an example of a memory device 110 as described with reference to FIG. 1, such as a DRAM device.

The power management component 205 (e.g., PMIC) may be coupled with memory device 215 or multiple memory devices. The power management component 205 may generate supply voltages to voltage rails 230-*a*, 230-*b*, 230-*c*, and 230-*d* of the network of components, thereby delivering power to the memory device 215. The supply voltage may be generated based on a feedback signal received at the feedback component 210. The feedback signal may be transmitted from the feedback component 225 of memory device 215 to the feedback component 210 of the power management component 205.

The power management component 205 may detect the feedback signal and adjust the voltage supplied to the memory device 215 (e.g., supply voltage) accordingly. For example, the feedback component 210 may increase the supply voltage based on a determination that a voltage rail 230 is below a lower voltage threshold. In some examples, the feedback component 210 may decrease the supply voltage based on a determination that a voltage rail 230 is above a higher voltage threshold. In some examples, the power management component 205 may be an example of a PMIC.

The power management component 205 may be in electronic communication with the memory device 215 using voltage rails 230-a, 230-b, 230-c, and 230-d. The voltage rails 230-a, 230-b, 230-c, and 230-d may be configured to receive the supply voltage and deliver power to the memory device 215. In some examples, the voltage rails 230-a, 230-b, 230-c, and 230-d may be shorted with each other in any combination to cause a feedback signal to be sent from the feedback component 225 of the memory device 215 to the feedback component 210 of the power management component 205.

The memory device 215 may include short components 235-a, 235-b, and 235-c. Short components 235-a, 235-b, and 235-c may each be an example of a transistor or other switching component. In some examples, the short component 235-a may be in electronic communication with voltage rail 230-a and voltage rail 230-b. The short component 235-b may be in electronic communication with voltage rail 230-b and voltage rail 230-c. The short component 235-c may be in electronic communication with voltage rail 230-c and voltage rail 230-d.

The memory device 215 may detect a condition of the memory device, a condition of a network of components for delivering power (e.g., voltage rails 230-a, 230-b, 230-c, and 230-d), or both. In such cases, the memory device 215 may short a first rail (e.g., voltage rail 230-a) with a voltage source using any of short components 235-a, 235-b, and 235-c. In some cases, the voltage source can be voltage rail 230-b, 230-c, or 230-d or a different voltage source (e.g., a ground node). For example, the memory device 215 may short voltage rail 230-a with voltage rail 230-b via short component 235-a based on detecting the condition. Each short component 235-a, 235-b, and 235-c may short any two voltage rails 230-a, 230-b, 230-c, and 230-d together. For example, short component 235-b may short voltage rail 230-b with voltage rail 230-c, and short component 235-c may short voltage rail 230-c with voltage rail 230-d.

The memory device 215 may include feedback component 225. The feedback component 225 may be in electronic communication with short components 235-a, 235-b, and 235-c. In such cases, the feedback component 225 may generate a feedback signal based on shorting at least two voltage rails 230-a, 230-b, 230-c, and 230-d. The feedback component 225 may transmit the feedback signal to the power management component 205. In some cases, the feedback signal may be an example of a voltage pulse. In some examples, the feedback component 225 may be coupled with sensors on the memory die 220-a and memory die 220-b to measure supply voltages. The feedback component 225 may be implemented by a controller of FIG. 1.

In some examples, the memory device 215 may select which voltage rails 230-a, 230-b, 230-c, and 230-d to short together. For example, the memory device 215 may select voltage rail 230-a to short with voltage rail 230-b, 230-c, or 230-d based on identifying an error with any one of voltage rail 230-b, 230-c, or 230-d. In such cases, the first voltage rail may be selected to short with a second voltage rail that includes an error. In other examples, the memory device 215 may select voltage rail 230-a to short with voltage rail 230-b, 230-c, or 230-d based on identifying an error with voltage rail 230-a. The voltage rails 230-a, 230-b, 230-c, and 230-d may be shorted with each other in any combination based on detecting an error on any of the voltage rails 230-a, 230-b, 230-c, and 230-d.

The memory device 215 may select which voltage rails 230-a, 230-b, 230-c, and 230-d to short together based on a sensed temperature, voltage, or both. For example, the memory device 215 may determine that a temperature at a location of the memory device 215 satisfies a temperature threshold. In such cases, the memory device 215 may short a first voltage rail (e.g., voltage rail 230-a) with the voltage source (e.g., voltage rails 230-b, 230-c, 230-d, or ground node) via one of short component 235-a, 235-b, or 235-c.

In other examples, the memory device 215 may sense a voltage at a location of the memory device 215 and determine that the sensed voltage satisfies a voltage threshold. In such cases, the memory device 215 may short first voltage rail (e.g., voltage rail 230-a) with the voltage source (e.g., voltage rails 230-b, 230-c, 230-d, or ground node) via one of short component 235-a, 235-b, or 235-c. The voltage of the voltage source may be different than the voltage of the first voltage rail.

Based on the detected condition (e.g., sensed voltage, temperature, or both), the memory device 215 may determine a duration to short two of the voltage rails 230-a, 230-b, 230-c, and 230-d. In other examples, the memory device 215 may determine a pulse pattern for shorting two of the voltage rails 230-a, 230-b, 230-c, and 230-d based on the detected condition. The memory device 215 may short the two voltage rails 230-a, 230-b, 230-c, and 230-d according to the determined duration, pulse pattern, or both. The pulse pattern may be based on a voltage of a voltage rail 230-a, 230-b, 230-c, and 230-d being below a lower voltage threshold of a target range, the voltage of a voltage rail 230-a, 230-b, 230-c, and 230-d being above a higher voltage threshold of the target range, or both. Examples of pulse patterns may include various combinations of different length pulses (e.g., patterns of long pulses and short pulses). In some examples, the pulse patterns may include various combinations of pulses of similar or the same length.

The memory device 215 may determine that a voltage of voltage rail 230-a, 230-b, 230-c, or 230-d is below the lower voltage threshold of a target range, in some examples. In such examples, if the voltage of voltage rail 230-a is below the lower voltage threshold of the target range, then the short component 235-a may short voltage rail 230-a with voltage rail 230-b, 230-c, or 230-d according to a first pulse pattern and a first duration. In some cases, the lower voltage threshold may include multiple voltage thresholds.

In other examples, the memory device 215 may also determine that a voltage of voltage rail 230-a, 230-b, 230-c, or 230-d is above the higher voltage threshold of a target range. For example, if the voltage of voltage rail 230-a is above the higher voltage threshold of the target range, then the short component 235-a may short voltage rail 230-a with voltage rail 230-b, 230-c, or 230-d according to a second pulse pattern and a second duration different than the first pulse pattern and the first duration. In some cases, the higher voltage threshold may include multiple voltage thresholds. The voltage rails 230-a, 230-b, 230-c, and 230-d may be shorted with each other in any combination of pulse pattern, duration, or both.

Techniques are provided herein for using the voltage rails 230-a, 230-b, 230-c, and 230-d and short components 235-a, 235-b, and 235-c to provide feedback to the power management component 205 by shorting two of the voltage rails 230-a, 230-b, 230-c, and 230-d based on detecting a condition of the memory device 215. The condition may be detected by the power management component 205 (and/or by another device, such as a host device) and may be used by the power management component 205 to regulate (e.g., maintain or adjust) a voltage supplied to memory device 215 or to regulate another operational aspect of memory device 215.

Figure 3:
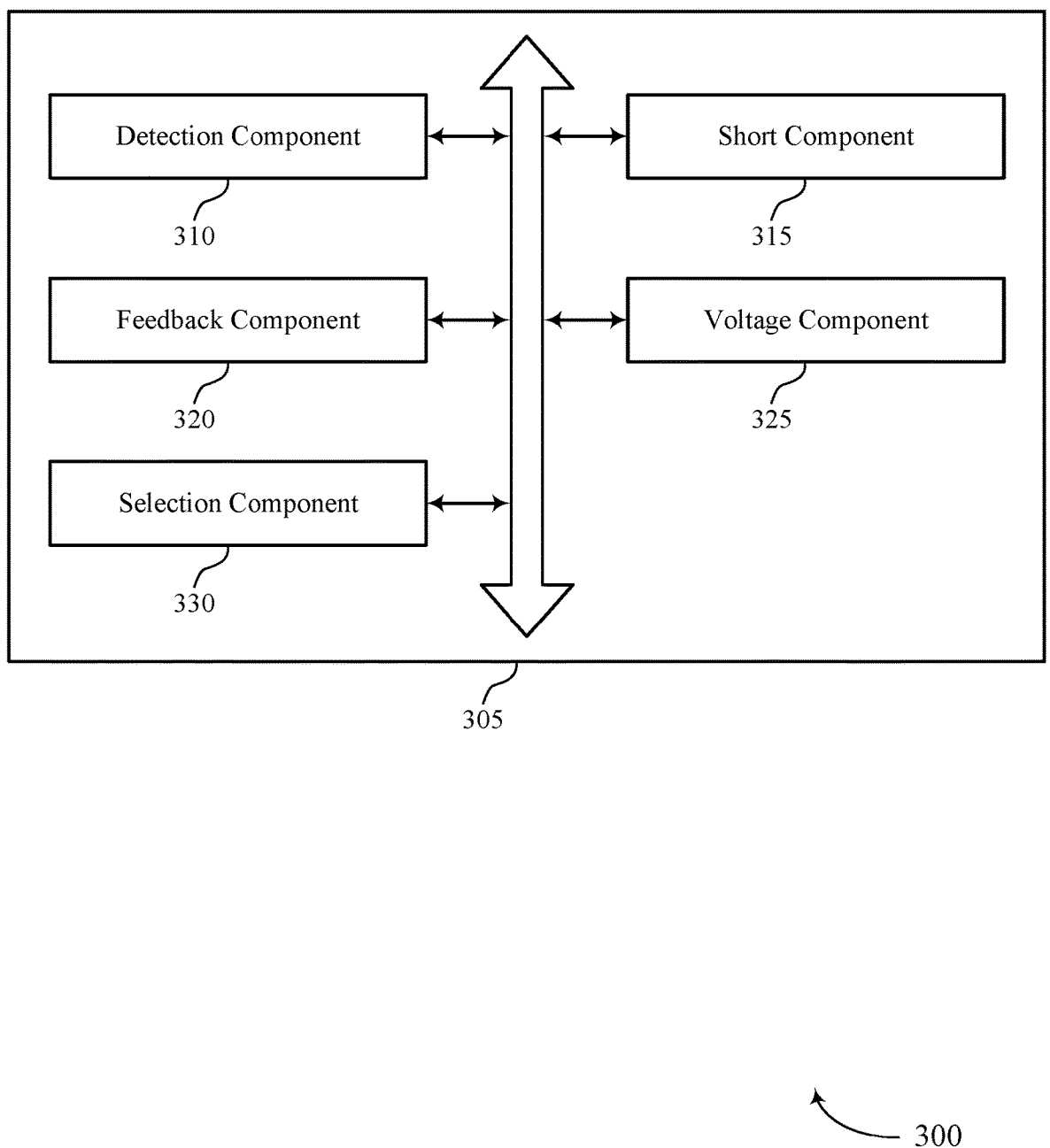
FIG. 3 shows a block diagram of a memory device that supports feedback for power management of a memory die using shorting in accordance with examples as disclosed herein.

FIG. 3 shows a block diagram 300 of a memory device 305 that supports feedback for power management of a memory die using shorting in accordance with examples as disclosed herein. The memory device 305 may be an example of aspects of a memory device as described with reference to FIGS. 1 and 2. The memory device 305 may include a detection component 310, a short component 315, a feedback component 320, a voltage component 325, and a selection component 330. Each of these modules may communicate, directly or indirectly, with one another (e.g., via one or more buses).

The detection component 310 may detect a condition of a network of components for delivering power that is coupled with a memory array. In some examples, the detection component 310 may determine a duration for shorting the first rail with the voltage source based on the detected condition, where shorting the first rail with the voltage source is done for the duration.

In some examples, the detection component 310 may determine a pulse pattern for shorting the first rail with the voltage source based on the detected condition, where shorting the first rail with the voltage source is done according to the pulse pattern. In some cases, the pulse pattern is based on a voltage of a rail of the network of components for delivering power being below a lower voltage threshold of a target range, the voltage of the rail of the network of components for delivering power being above a higher voltage threshold of the target range, or both.

The short component 315 may short a first rail of the network of components for delivering power with a voltage source based on detecting the condition. In some examples, the short component 315 may determine that a temperature at a location of the network of components for delivering power or the memory array satisfies a temperature threshold, where shorting the first rail with the voltage source is based on determining that the temperature satisfies the temperature threshold.

The feedback component 320 may generate a feedback signal across the first rail of the network of components for delivering power based on shorting the first rail. In some examples, the feedback component 320 may transmit, to a power management integrated circuit, the feedback signal across a signal path operable to supply a voltage to the first rail of the network of components for delivering power based on generating the feedback signal. In some cases, the feedback signal includes a voltage pulse.

The voltage component 325 may sense a voltage at a location of the network of components for delivering power or the memory array. In some examples, the voltage component 325 may determine that the sensed voltage satisfies a voltage threshold based on sensing the voltage at the location, where shorting the first rail with the voltage source is based on determining that the sensed voltage satisfies the voltage threshold.

In some examples, the voltage component 325 may determine that a voltage of a rail of the network of components for delivering power is below a lower voltage threshold of a target range, where detecting the condition of the network of components for delivering power is based on determining that the voltage is below the lower voltage threshold.

In some examples, the voltage component 325 may determine that a voltage of a rail of the network of components for delivering power is above a higher voltage threshold of a target range, where detecting the condition of the network of components for delivering power is based on determining that the voltage is above the higher voltage threshold.

In some cases, the voltage source includes a second rail of the network of components for delivering power. In some cases, the first rail includes a first voltage level and the second rail of includes a second voltage level different than the first voltage level. In some cases, the voltage source includes a ground node.

The selection component 330 may select the first rail of the network of components for delivering power to short with the voltage source based on identifying an error of a rail of the network of components for delivering power. In some examples, the selection component 330 may select the first rail of the network of components for delivering power to short with the voltage source based on identifying an error of the first rail of the network of components for delivering power.

Figure 4:
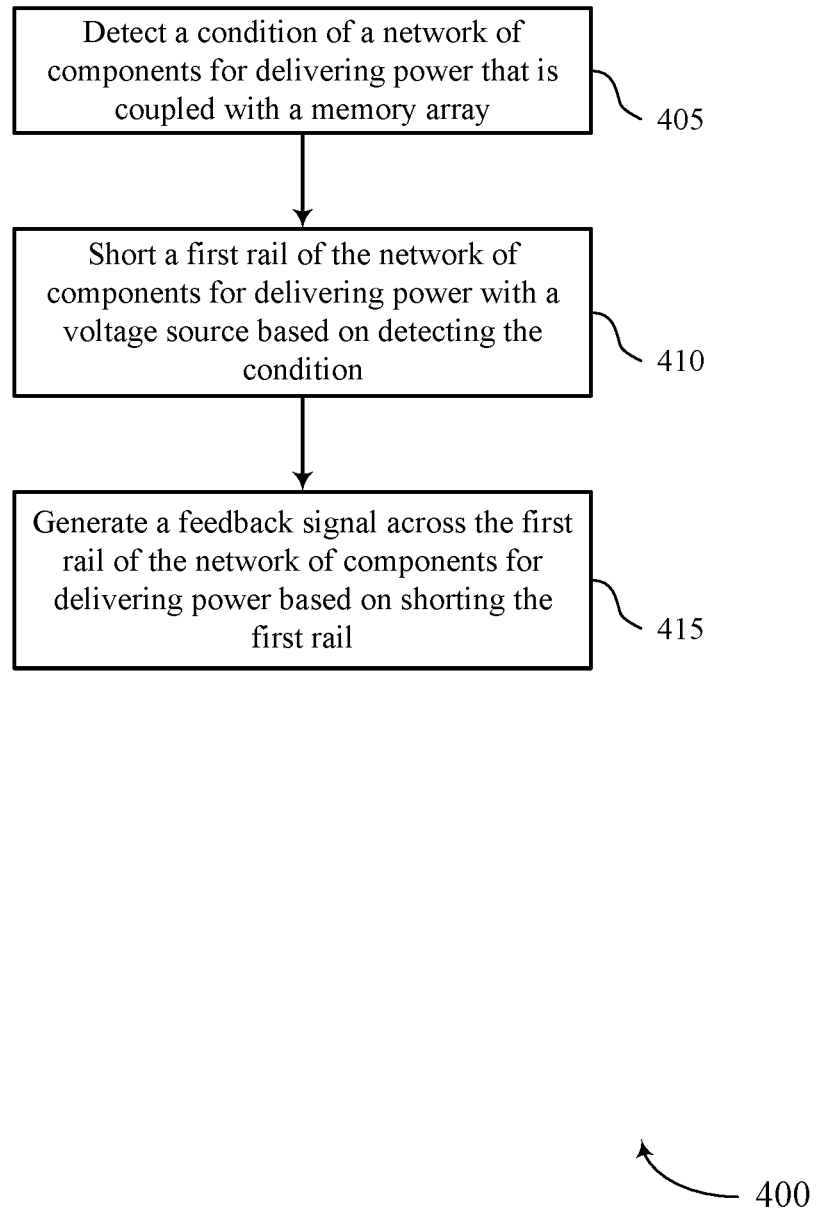
FIG. 4 shows a flowchart illustrating a method or methods that support feedback for power management of a memory die using shorting in accordance with examples as disclosed herein.

FIG. 4 shows a flowchart illustrating a method 400 that supports feedback for power management of a memory die using shorting in accordance with examples as disclosed herein. The operations of method 400 may be implemented by a memory device or its components as described herein. For example, the operations of method 400 may be performed by a memory device as described with reference to FIG. 3. In some examples, a memory device may execute a set of instructions to control the functional elements of the memory device to perform the described functions. Additionally or alternatively, a memory device may perform aspects of the described functions using special-purpose hardware.

At 405, the memory device may detect a condition of a network of components for delivering power that is coupled with a memory array. The operations of 405 may be performed according to the methods described herein. In some examples, aspects of the operations of 405 may be performed by a detection component as described with reference to FIG. 3.

At 410, the memory device may short a first rail of the network of components for delivering power with a voltage source based on detecting the condition. The operations of 410 may be performed according to the methods described herein. In some examples, aspects of the operations of 410 may be performed by a short component as described with reference to FIG. 3.

At 415, the memory device may generate a feedback signal across the first rail of the network of components for delivering power based on shorting the first rail. The operations of 415 may be performed according to the methods described herein. In some examples, aspects of the operations of 415 may be performed by a feedback component as described with reference to FIG. 3.

In some examples, an apparatus as described herein may perform a method or methods, such as the method 400. The apparatus may include features, means, or instructions (e.g., a non-transitory computer-readable medium storing instructions executable by a processor) for detecting a condition of a network of components for delivering power that is coupled with a memory array, shorting a first rail of the network of components for delivering power with a voltage source based on detecting the condition, and generating a feedback signal across the first rail of the network of components for delivering power based on shorting the first rail.

Some examples of the method 400 and the apparatus described herein may further include operations, features, means, or instructions for transmitting, to a power management integrated circuit, the feedback signal across a signal path operable to supply a voltage to the first rail of the network of components for delivering power based on generating the feedback signal. Some examples of the method 400 and the apparatus described herein may further include operations, features, means, or instructions for selecting the first rail of the network of components for delivering power to short with the voltage source based on identifying an error of a rail of the network of components for delivering power. Some examples of the method 400 and the apparatus described herein may further include operations, features, means, or instructions for selecting the first rail of the network of components for delivering power to short with the voltage source based on identifying an error of the first rail of the network of components for delivering power.

In some examples of the method 400 and the apparatus described herein, detecting the condition further may include operations, features, means, or instructions for determining that a temperature at a location of the network of components for delivering power or the memory array satisfies a temperature threshold, where shorting the first rail with the voltage source may be based on determining that the temperature satisfies the temperature threshold. In some examples of the method 400 and the apparatus described herein, detecting the condition further may include operations, features, means, or instructions for sensing a voltage at a location of the network of components for delivering power or the memory array, and determining that the sensed voltage satisfies a voltage threshold based on sensing the voltage at the location, where shorting the first rail with the voltage source may be based on determining that the sensed voltage satisfies the voltage threshold.

Some examples of the method 400 and the apparatus described herein may further include operations, features, means, or instructions for determining a duration for shorting the first rail with the voltage source based on the detected condition, where shorting the first rail with the voltage source may be done for the duration. Some examples of the method 400 and the apparatus described herein may further include operations, features, means, or instructions for determining a pulse pattern for shorting the first rail with the voltage source based on the detected condition, where shorting the first rail with the voltage source may be done according to the pulse pattern.

In some examples of the method 400 and the apparatus described herein, the pulse pattern may be based on a voltage of a rail of the network of components for delivering power being below a lower voltage threshold of a target range, the voltage of the rail of the network of components for delivering power being above a higher voltage threshold of the target range, or both. Some examples of the method 400 and the apparatus described herein may further include operations, features, means, or instructions for determining that a voltage of a rail of the network of components for delivering power may be below a lower voltage threshold of a target range, where detecting the condition of the network of components for delivering power may be based on determining that the voltage may be below the lower voltage threshold.

Some examples of the method 400 and the apparatus described herein may further include operations, features, means, or instructions for determining that a voltage of a rail of the network of components for delivering power may be above a higher voltage threshold of a target range, where detecting the condition of the network of components for delivering power may be based on determining that the voltage may be above the higher voltage threshold. In some examples of the method 400 and the apparatus described herein, the voltage source includes a second rail of the network of components for delivering power. In some examples of the method 400 and the apparatus described herein, the first rail includes a first voltage level and the second rail of includes a second voltage level different than the first voltage level. In some examples of the method 400 and the apparatus described herein, the voltage source includes a ground node. In some examples of the method 400 and the apparatus described herein, the feedback signal includes a voltage pulse.

Figure 5:
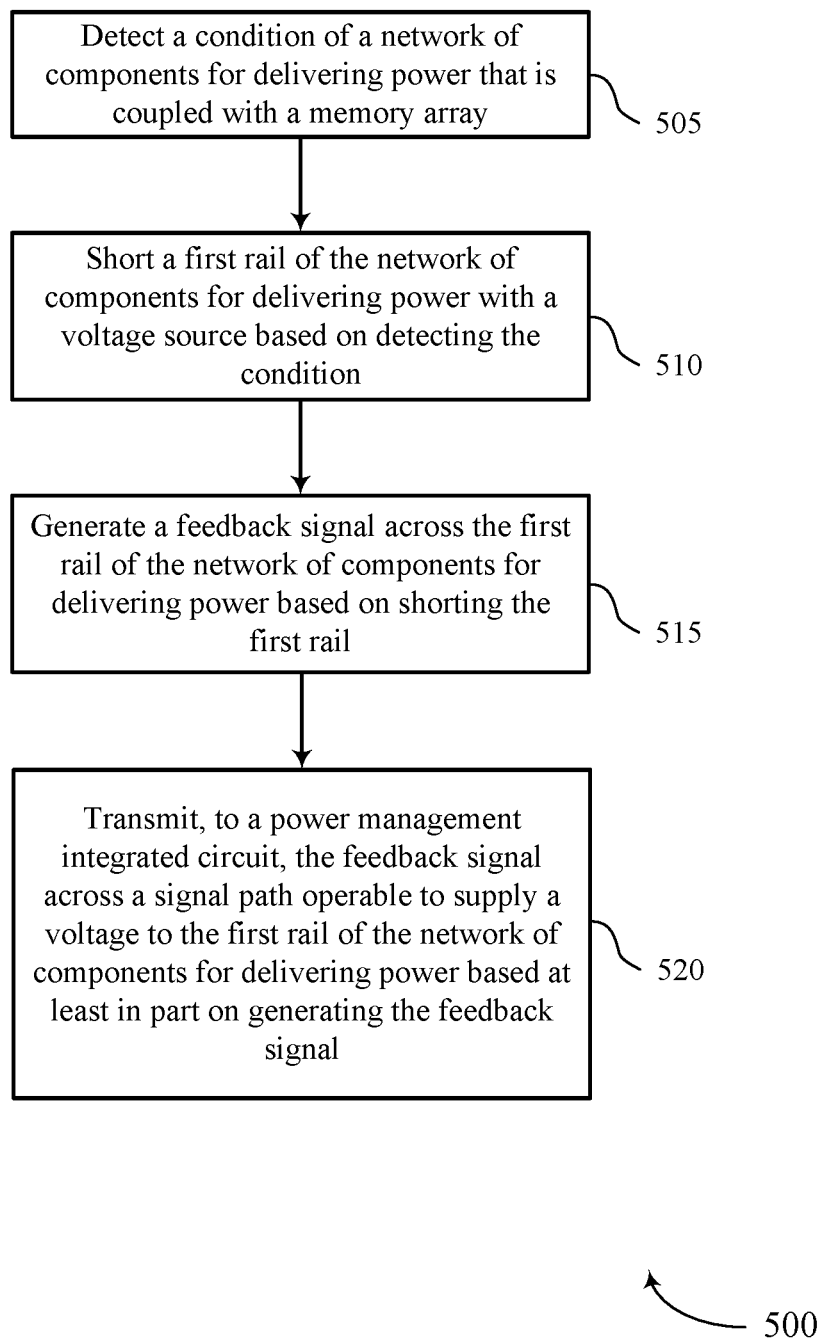
FIG. 5 shows a flowchart illustrating a method or methods that support feedback for power management of a memory die using shorting in accordance with examples as disclosed herein.

FIG. 5 shows a flowchart illustrating a method 500 that supports feedback for power management of a memory die using shorting in accordance with examples as disclosed herein. The operations of method 500 may be implemented by a memory device or its components as described herein. For example, the operations of method 500 may be performed by a memory device as described with reference to FIG. 3. In some examples, a memory device may execute a set of instructions to control the functional elements of the memory device to perform the described functions. Additionally or alternatively, a memory device may perform aspects of the described functions using special-purpose hardware.

At 505, the memory device may detect a condition of a network of components for delivering power that is coupled with a memory array. The operations of 505 may be performed according to the methods described herein. In some examples, aspects of the operations of 505 may be performed by a detection component as described with reference to FIG. 3.

At 510, the memory device may short a first rail of the network of components for delivering power with a voltage source based on detecting the condition. The operations of 510 may be performed according to the methods described herein. In some examples, aspects of the operations of 510 may be performed by a short component as described with reference to FIG. 3.

At 515, the memory device may generate a feedback signal across the first rail of the network of components for delivering power based on shorting the first rail. The operations of 515 may be performed according to the methods described herein. In some examples, aspects of the operations of 515 may be performed by a feedback component as described with reference to FIG. 3.

At 520, the memory device may transmit, to a power management integrated circuit, the feedback signal across a signal path operable to supply a voltage to the first rail of the network of components for delivering power based on generating the feedback signal. The operations of 520 may be performed according to the methods described herein. In some examples, aspects of the operations of 520 may be performed by a feedback component as described with reference to FIG. 3.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include an array of memory cells, a power management integrated circuit in electronic communication with the array of memory cells, and a controller operable to cause the apparatus to detect a condition of a network of components for delivering power coupled with the array of memory cells, short a first rail of the network of components for delivering power with a voltage source based on detecting the condition, and generate a feedback signal across the first rail of the network of components for delivering power based on shorting the first rail.

Some examples may further include transmitting, to the power management integrated circuit, the feedback signal across a signal path operable to supply a voltage to the first rail of the network of components for delivering power based on generating the feedback signal. Some examples may further include selecting the first rail of the network of components for delivering power to short with the voltage source based on identifying an error of a rail of the network of components for delivering power.

An apparatus is described. The apparatus may include a detection component operable to detect a condition of a network of components for delivering power that is coupled with an array of memory cells, a short component operable to short a first rail of the network of components for delivering power with a voltage source based on detecting the condition, and a feedback component operable to generate a feedback signal across the first rail of the network of components for delivering power based on shorting the first rail.

In some examples, the feedback component may be further operable to transmit, to a power management integrated circuit, the feedback signal across a signal path operable to supply a voltage to the first rail of the network of components for delivering power based on generating the feedback signal. Some examples of the apparatus may include a selection component operable to select the first rail of the network of components for delivering power to short with the voltage source based on identifying an error of a rail of the network of components for delivering power.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   shorting a first voltage rail of a plurality of voltage rails with a second voltage rail of the plurality of voltage rails based at least in part on a condition of the plurality of voltage rails, a condition of a memory array coupled with the plurality of voltage rails, or both; and
   transmitting a voltage pulse to a power management integrated circuit, the voltage pulse being generated based at least in part on shorting the first voltage rail with the second voltage rail.

2. The method of claim 1, wherein transmitting the voltage pulse comprises:
   transmitting the voltage pulse to the power management integrated circuit across a signal path supplying voltage to the first voltage rail.

3. The method of claim 1, further comprising:
   selecting the first voltage rail to short with the second voltage rail based at least in part on an error of at least one voltage rail of the plurality of voltage rails, wherein the error of the at least one voltage rail comprises the condition of the plurality of voltage rails.

4. The method of claim 1, further comprising:
   selecting the first voltage rail to short with the second voltage rail based at least in part on an error of the first voltage rail, wherein the error of the first voltage rail comprises the condition of the plurality of voltage rails.

5. The method of claim 1, further comprising:
   sensing a temperature at a location of the plurality of voltage rails, wherein shorting the first voltage rail with the second voltage rail is based at least in part on the temperature satisfying a temperature threshold.

6. The method of claim 1, further comprising:
   sensing a temperature at a location of the memory array, wherein shorting the first voltage rail with the second voltage rail is based at least in part on the temperature satisfying a temperature threshold.

7. The method of claim 1, further comprising:
   sensing a voltage at a location of the plurality of voltage rails, wherein shorting the first voltage rail with the second voltage rail is based at least in part on the voltage satisfying a voltage threshold.

8. The method of claim 1, further comprising:
   sensing a voltage at a location of the memory array, wherein shorting the first voltage rail with the second voltage rail is based at least in part on the voltage satisfying a voltage threshold.

9. The method of claim 1, wherein shorting the first voltage rail with the second voltage rail comprises:
shorting the first voltage rail with the second voltage rail for a time duration that is based at least in part on the condition of the plurality of voltage rails, or the condition of the memory array, or any combination thereof.

10. The method of claim 1, wherein shorting the first voltage rail with the second voltage rail comprises:
shorting the first voltage rail with the second voltage rail using a pulse pattern that is based at least in part on the condition of the plurality of voltage rails, or the condition of the memory array, or both.

11. The method of claim 10, wherein the pulse pattern is based at least in part on a voltage of a voltage rail of the plurality of voltage rails being below a first voltage threshold, the voltage of the voltage rail of the plurality of voltage rails being above a second voltage threshold different than the first voltage threshold, or both.

12. The method of claim 1, further comprising:
sensing a voltage of a voltage rail of the plurality of voltage rails, wherein the condition of the plurality of voltage rails is detected based at least in part on the voltage being below a voltage threshold.

13. The method of claim 1, further comprising:
sensing a voltage of a voltage rail of the plurality of voltage rails, wherein the condition of the plurality of voltage rails is detected based at least in part on the voltage being above a voltage threshold.

14. The method of claim 1, wherein the first voltage rail comprises a first voltage level and the second voltage rail comprises a second voltage level different than the first voltage level.

15. An apparatus, comprising:
an array of memory cells,
a power management integrated circuit in electronic communication with the array of memory cells, and
a controller operable to cause the apparatus to:
short a first voltage rail of a plurality of voltage rails with a second voltage rail of the plurality of voltage rails based at least in part on a condition of the plurality of voltage rails, a condition of the array of memory cells, or both; and
transmit a voltage pulse to the power management integrated circuit, the voltage pulse being generated based at least in part on shorting the first voltage rail with the second voltage rail.

16. The apparatus of claim 15, wherein the controller is further operable to cause the apparatus to:
transmit the voltage pulse to the power management integrated circuit across a signal path supplying voltage to the first voltage rail.

17. The apparatus of claim 15, wherein the controller is further operable to cause the apparatus to:
select the first voltage rail to short with the second voltage rail based at least in part on an error of at least one voltage rail of the plurality of voltage rails, wherein the error of the at least one voltage rail comprises the condition of the plurality of voltage rails.

18. An apparatus, comprising:
a detection component configured to detect a condition of a plurality of voltage rails coupled with an array of memory cells;
a short component configured to short a first voltage rail of the plurality of voltage rails with a second voltage rail of the plurality of voltage rails based at least in part on the condition; and
a feedback component configured to transmit a voltage pulse to a power management integrated circuit, the voltage pulse being generated based at least in part on shorting the first voltage rail with the second voltage rail.

19. The apparatus of claim 18, wherein the feedback component is further configured to transmit the voltage pulse to the power management integrated circuit across a signal path supplying voltage to the first voltage rail of the plurality of voltage rails.

20. The apparatus of claim 18, further comprising:
a selection component configured to select the first voltage rail to short with the second voltage rail based at least in part on an error of at least one voltage rail of the plurality of voltage rails, wherein the error of the at least one voltage rail comprises the condition of the plurality of voltage rails.

* * * * *